United States Patent
Klipper et al.

(10) Patent No.: US 6,356,127 B1
(45) Date of Patent: Mar. 12, 2002

(54) PHASE LOCKED LOOP

(75) Inventors: Joshua Klipper, Netanya; Moshe Nurko, Petah Tikva; Udi Agami, Rishon Le'zion, all of (IL)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 09/757,554

(22) Filed: Jan. 10, 2001

(51) Int. Cl.[7] .................................................. H03L 7/06
(52) U.S. Cl. ......................................... 327/156; 375/375
(58) Field of Search .................................. 327/155, 156, 327/160, 161, 163; 375/215, 226, 294, 373, 375, 376

(56) References Cited

U.S. PATENT DOCUMENTS

| | | | | |
|---|---|---|---|---|
| 5,705,945 A | * | 1/1998 | Wee | 327/160 |
| 6,064,707 A | * | 5/2000 | Woodman, Jr. | 327/163 |
| 6,073,259 A | * | 6/2000 | Saetschev et al. | 327/161 |
| 6,107,843 A | * | 8/2000 | de Gouy et al. | 327/156 |
| 6,167,103 A | * | 12/2000 | Hardin | 375/376 |
| 6,292,507 B1 | * | 9/2001 | Hardin et al. | 375/376 |

* cited by examiner

Primary Examiner—Terry D. Cunningham
Assistant Examiner—Linh Nguyen
(74) Attorney, Agent, or Firm—Fogg, Slifer, Polglaze, Leffert & Jay, P.A.

(57) ABSTRACT

A known clock frequency is divided into at least two phases, and the rising and the falling edges of each of the divided signals are counted. The sum total of edges in a given time period is compared to a stored sum of edges during an earlier time period of the same duration. Adjustment to the local clock is made if sufficient differences are detected.

40 Claims, 3 Drawing Sheets

PHASE LOCKED LOOP

FIELD

The present invention relates generally to phase locked loops (PLLs).

BACKGROUND

Access equipment for telecommunications networks continues to evolve, with faster communications both desired and needed. Standards for such communications are also changing to accommodate increased available and necessary bandwidths, increased amounts of traffic, and the like. In order to keep pace with the ever-increasing speed and detail requirements of telecommunications systems, telecommunications equipment must also continue to advance. To that end, components are becoming smaller, communications are becoming faster, and error tolerances in such systems are dropping.

A typical access system for a telecommunications network is a digital loop carrier (DLC) platform, for example, the DCS-40, available from ADC Teledata, Herzliya, Israel. A typical DLC product consists of one or more remote terminals or units connected, often in a ring configuration, to a central unit or central office unit. The central office unit or terminal is connected to a switch by analog or digital interfaces. Transmission occurs between the central office terminal and the subscriber interfaces or remote units. Development of integrated synchronous digital hierarchy (SDH) and synchronous optical network (SONET) interfaces for this platform include a connection between the remote unit or units and the central unit over a high speed optical ring. SDH or SONET cards are integrated into the central and remote units.

Phase locked loops (PLLs) are used in communications equipment such as central and remote units of a DLC for locking the clocks of multiple units together so that all components of the system run at the same clock rate. A PLL is a mechanism by which timing information is transferred within a data stream and the receiver derives the signal element timing by locking its local clock to a reference clock. As communications equipment has continued to increase in complexity, speed, capability, the need for better and more accurate PLLs has become greater.

SUMMARY

In one embodiment, a method of locking a local clock to a reference clock includes dividing the local clock into a number of phases, and counting the total number of rising and falling edges of the local clock in a bank of difference counters. The total number of rising and falling edges in a predetermined time period is periodically summed by a summation counter, and the sum is compared to a stored summed total number of rising and falling edges in an identical earlier time period. The local clock is adjusted if the compared summed and stored totals differ by more than a predetermined amount.

In another embodiment, a phase locked loop includes a phase detector having a local clock signal input and a counter signal output. The phase detector includes a divider connected to the local clock signal input, a number of difference counters connected to receive divided signals from the divider, and a summation counter connected to the outputs of each of the difference counters and connected to receive an external latch signal to trigger summation of the difference counters.

Other embodiments are described and claimed.

DESCRIPTION OF EMBODIMENTS

In the following detailed description of the embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. It has proven convenient at times, principally for reasons of common usage, to refer to these signals as bits, values, elements, symbols, characters, terms, numbers, or the like. It should be borne in mind, however, that all of these and similar terms are associated with the appropriate physical quantities and are merely convenient labels applied to these quantities.

Unless specifically stated otherwise as apparent from the following discussions, it is appreciated that throughout the present invention, discussions utilizing terms such as processing, computing, calculating, determining, displaying, or the like refer to the action and processes of a computer system or similar electronic computing device that manipulates and transforms data represented as physical quantities within the computer registers and memories into data similarly represented as physical quantities within the computer system memories or registers.

In any kind of transmission application, with multiple units, there is one unit that receives a synchronous source or sends a synchronous source, and one or more remote units that lock to the frequency of the source. One common structure of such systems includes a common card local clock element which controls the local output frequency based on input voltage. The input voltage is connected to a digital to analog (D/A) converter to control output oscillator frequency. The digital value of the output frequency is written to memory, a register, or the like by a central processing unit (CPU). The CPU writes a digital word representative of the data read, and controls the output frequency of the unit. Any card that can serve as a synchronization source, such as a transmission card receiving E1 from central unit (CU), or receiving an external input at a central office, can use the PLL embodiments of the present invention.

Figure 1:
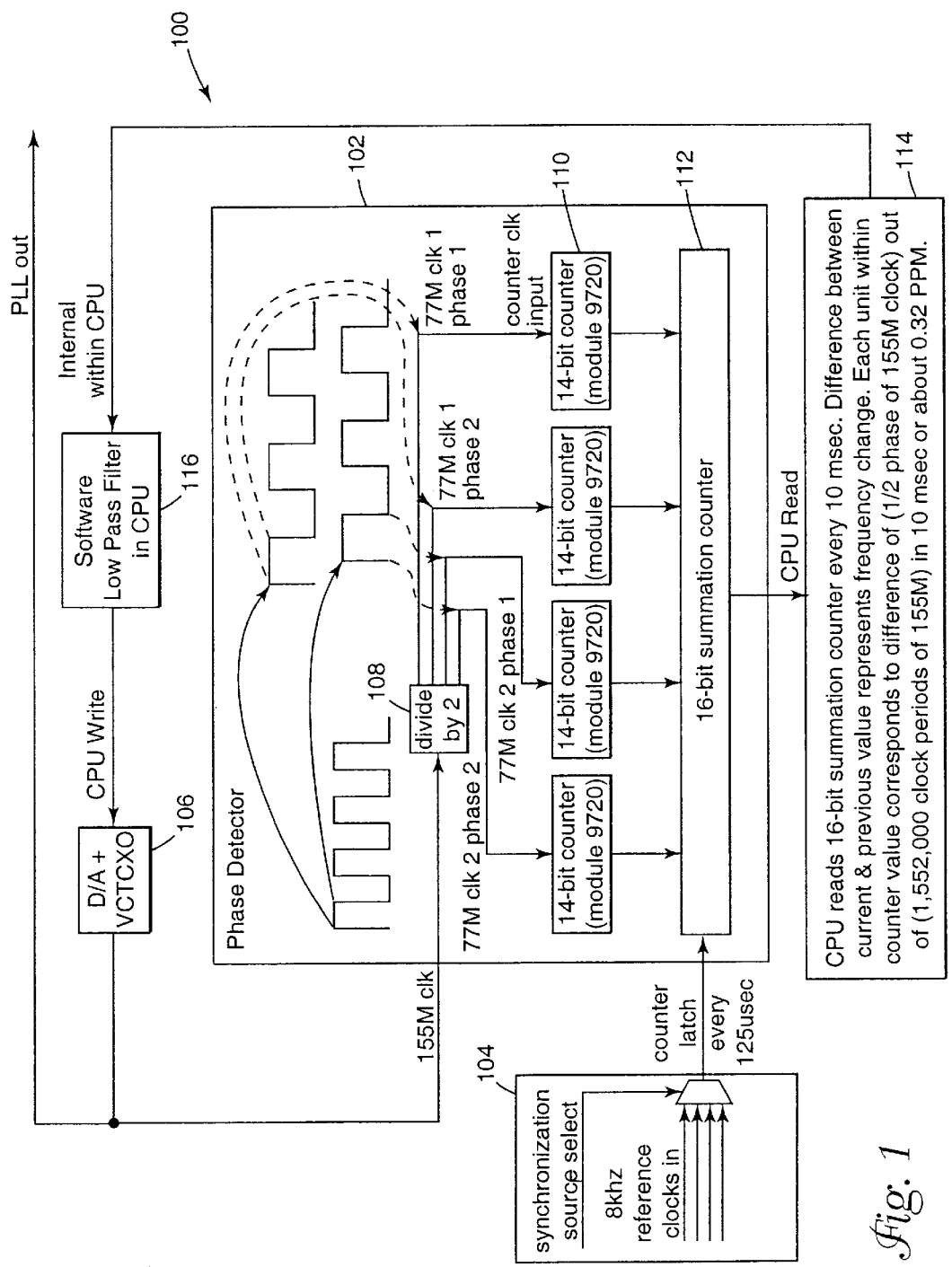
FIG. 1 is a block diagram view of an embodiment of the present invention.

FIG. 1 shows a block schematic diagram of a phase locked loop according to one embodiment of the present invention. Phase locked loop 100 comprises in one embodiment a counter module 102 connected to receive latch input from a reference clock 104 and to receive local clock input from a local clock 106. In one embodiment, the local clock 106 is a voltage controlled temperature compensated crystal oscillator (VCTCXO). In one embodiment, counter module 102 is a field programmable gate array (FPGA). A software module residing in memory of a central processing unit (CPU) in a remote unit of a telecommunications system such as a SONET/SDH system reads the output of the summation of the counters and processes them. Counter module 102 in one embodiment comprises a divider 108 which receives the local clock signal, in this embodiment generated by local clock 106. The divider 108 divides the incoming local clock signal into two separates phases, and feeds the resultant signals to a bank of counters 110.

In this embodiment, first and second phases of each of the divided clock signals are generated, and both the rising edge and the falling edge of each of the divided signals is used, creating four partial clock signals. All of the rising edges of the first clock signal are sent to one of the bank 110 of counters. All of the falling edges of the first clock signal are sent to another of the bank 110 of counters. All of the rising edges of the second clock signal are sent to a third of the bank 110 of counters, and all of the falling edges of the second clock signal are sent to a fourth of the bank 110 of counters. Each of the counters 110 counts its respective clock edges. A summation counter 112 receives count information from the bank 110 of counters and sums the count information therefrom. The summation counter 112 receives as a latch signal on a predetermined time period the external clock source to which the local clock is to be locked. At every latch, the counter values of each of the counters in bank 110 are latched into a register and summed together in summation counter 112.

During any given window of time, the counters 110 count the clock cycles during the window. The window time is derived from the reference clock driving the latch. If the local clock and the reference or source clock are locked to each other, then every window contains exactly the same number of clock cycles. It should be understood that the time period is chosen in various embodiments to accommodate the local clock. The counters 110 determine the accuracy of the correction that can be made. The more cycles that are counted, in a given time, the smaller the detectable error.

A wide choice of source clocks are available. For example, sources including but not limited to external clocks, an ATM switch, a received clock, an internal input clock, and the like are used in various embodiments. The particular source is selected as the latch to the summation counter.

In one embodiment, the local clock is a 155 MB clock. The 155 MB is a standard STM-1 rate. To improve resolution from a full clock period of about 6 nanoseconds for the 155 MB clock to half of a clock period of about 3 nanoseconds, the 155 MB clock is divided into two approximately 77 MB clocks, allowing the counting of both phases of the 155 MB clock. Further, both the rising and the falling edges of each phase are counted, so four separate sets of edges are counted. Accuracy in this embodiment is therefore equivalent to 310 MB. Errors up to 0.5 clock cycle are detectable.

The clock source 104 to which the VCTCXO 106 is locked is provided in one embodiment as an 8 KHz latch signal to the summation counter 112. At every latch (125 microseconds in one embodiment), the value of each of the four counters 110 is latched to a separate register and then summed together by the summation counter 112. In one embodiment, the counters 110 do not reset on every latch, but instead continue counting up to a predetermined maximum count. In one embodiment, the maximum count is modulo 9720 for 14 bit counters. Because the individual counters 110 do not reset every latch period, slow changes in clock frequency show up in the summation counter as slowly shifting counter values over many latch cycles.

For example, if the local clock is faster than the source clock, over time the counter values will increase. If the local clock is slower than the source clock, then over time the counter values will decrease. High frequency jitter will cause counter values which may increase in one cycle and decrease in another, such that over any significant amount of time, the changes will average to near zero and not cause any correction.

A central processing unit (CPU) 114 reads the counter value of the summation counter 112 on a predetermined read schedule. Over time, changing values in the summation counter indicate that the local clock and the reference clock are not synchronized. If the counter values shift upward, that is there are more counted clock edges, then the local clock is faster than the reference clock. If the counter values shift downward, that is there are fewer counted clock edges, then the local clock is slower than the reference clock. High frequency jitter may cause occasional jumps or dips in values, but over time, if the local clock and the reference clock are not synchronized, a pattern will show, and the high frequency jitter cancels about the nominal frequency.

The counters 110 do not need to be reset after every latch of the reference clock. In one embodiment, the size of the counters 110 is set such that the maximum counter value of the counters 110 is sufficiently large that the maximum number of clock cycles that the count can differ from during one read time cycle for the CPU is less than the full cycle of the counters 110. The CPU doesn't need to read the summation counter value every latch period of the reference clock. Instead, in one embodiment the CPU reads about every 10 milliseconds. The difference counters 110 are made large enough that a full time period between CPU reads of the summation counter 112, taking the absolute widest range of clocks to look at, will not be a full count through the difference counters 110.

It should be seen that determining the clock cycles, the time window for taking counter 110 readings, and CPU read frequencies are dependent upon the variables in the system, and different read times for the CPU are therefore determined by the clock cycles. The CPU reading therefore checks for all errors during the read time, in one embodiment about 10 milliseconds. Counters 110 are in one embodiment reset on system initialization. In another embodiment, counters 110 are reset on a change of clock source.

In one embodiment, jitter attenuation is accomplished by filtering the CPU read data values through a low pass filter 116. This is accomplished either internal or external to the CPU. The CPU reads the counter values every 10 milliseconds and can implement in various embodiments a number of different Type I, Order 1 or Type II, Order 2 Low Pass Filters having the following general form:

$$Y_n = B_0 * (R_n - M) + B_1 * (R_{n-1} - M) + A_1 * Y_{n-1}$$

where:

$Y_n$=16 bit 2s complement number to be written to D/A converter after translation from 2s complement form.

$Y_{n-1}$=previous value written to D/A converter $B_0$, $B_1$=filter type constants $A_1$=constant per table (always 1 for a type 2 order 2 filter)
$R_n$, $R_{n-1}$=previous value read from difference counter
M=middle value (in one embodiment 19440)

With a sampling rate of 10 milliseconds, the phase detector enables a 3 dB point for jitter attenuation of between 0.1 KHz to 10 Hz depending upon the filter constants. This provides flexibility to fine tune the device performance.

The clock source to which the VCTCXO must be locked is provided in one embodiment as an 8 KHz latch signal to the counter, resulting in a latch period of approximately 125 microseconds. At each latch, each of the four counter 110 values are latched to a separate register and then summed together by a summation counter 112.

In another embodiment, a software implementation of the device allows a flexible mechanism for detecting input signals which are out of range, or failure states in which the PLL cannot properly track the input signal. Simple tests which check that the counter value read does not deviate from previously read counter values by more than a predetermined amount are used to detect input signals which are out of range. More complex tests are used in other embodiments to check that the counter values do not suffer from excessive jitter or phase hits, and are within the scope of the invention.

In various embodiments, the software module comprises a storage register to store a plurality of summation counter values, a read module to periodically read a value from the summation counter, and a comparison module to compare a current summation counter value to a last of the stored plurality of summation counter values. In further embodiments, the software module includes an error checking module to disable further summation counter reading if a reference signal to the phase locked loop is lost.

In another embodiment, after a loss of signal from the reference clock, holdover at the last known valid frequency as required by clock standards is implemented as follows. A set of last values is stored in memory by the CPU in one embodiment, for example the values passed to the D/A for the previous 10 seconds (stored in a buffer or register or the like). When a signal is lost, the software ignores further counter values, and slowly returns the D/A to the last valid value. This value is then kept fixed until the input is returned. Frequency accuracy is then a function only of the intrinsic performance of the VCTCXO and the stability of the D/A output.

This software based implementation provides a flexible solution which is improved further by better filter algorithms for elimination of high frequency jitter and the like, which are continuously being improved. Different filters for different transitions of reference clocks and signals are easily implemented.

The embodiments described above are more cost effective than traditional solutions since a CPU is already required on virtually all synchronous optical network (SONET)/SDH modules. This CPU is used in various embodiments to implement the PLL solutions described above and below. No additional hardware such as a digital signal processor (DSP) is needed, since the CPU is capable of handling the software implementation. In one embodiment, the counters are implemented in an FPGA together with all the clock selection logic. These characteristics and the flexibility of the solution make them well suited for implementation in SONET/SDH access equipment.

In yet another embodiment, the circuitry or software of the various PLL embodiments described herein reside both in a central unit (CU) and one or more remote units (RU) connected in an SDH ring with the CU. In the CU, the input is in one embodiment an external clock, and in the RU, the input is generally a received clock. In another embodiment, the input to the RU is the external clock. Such an input is often used if there are a large number of elements in the SDH ring. In such a configuration, in one embodiment, a global positioning system (GPS) is used to provide the external clock to the various RUs. If no external clock is present at the CU, the system free runs, and other RUs lock to the free running CU clock, with the intrinsic accuracy of the VCTCXO.

Algorithms for locking a source clock to a local clock are driven by the required accuracy needed in the system. The accuracy required by today's systems is far more stringent than in past systems. The amount of jitter that is acceptable to be introduced is lower. The filters therefore must be better, and the errors to be detected are smaller. With stricter requirements, a higher frequency input clock is used, and hardware implementation becomes more difficult.

Figure 2:
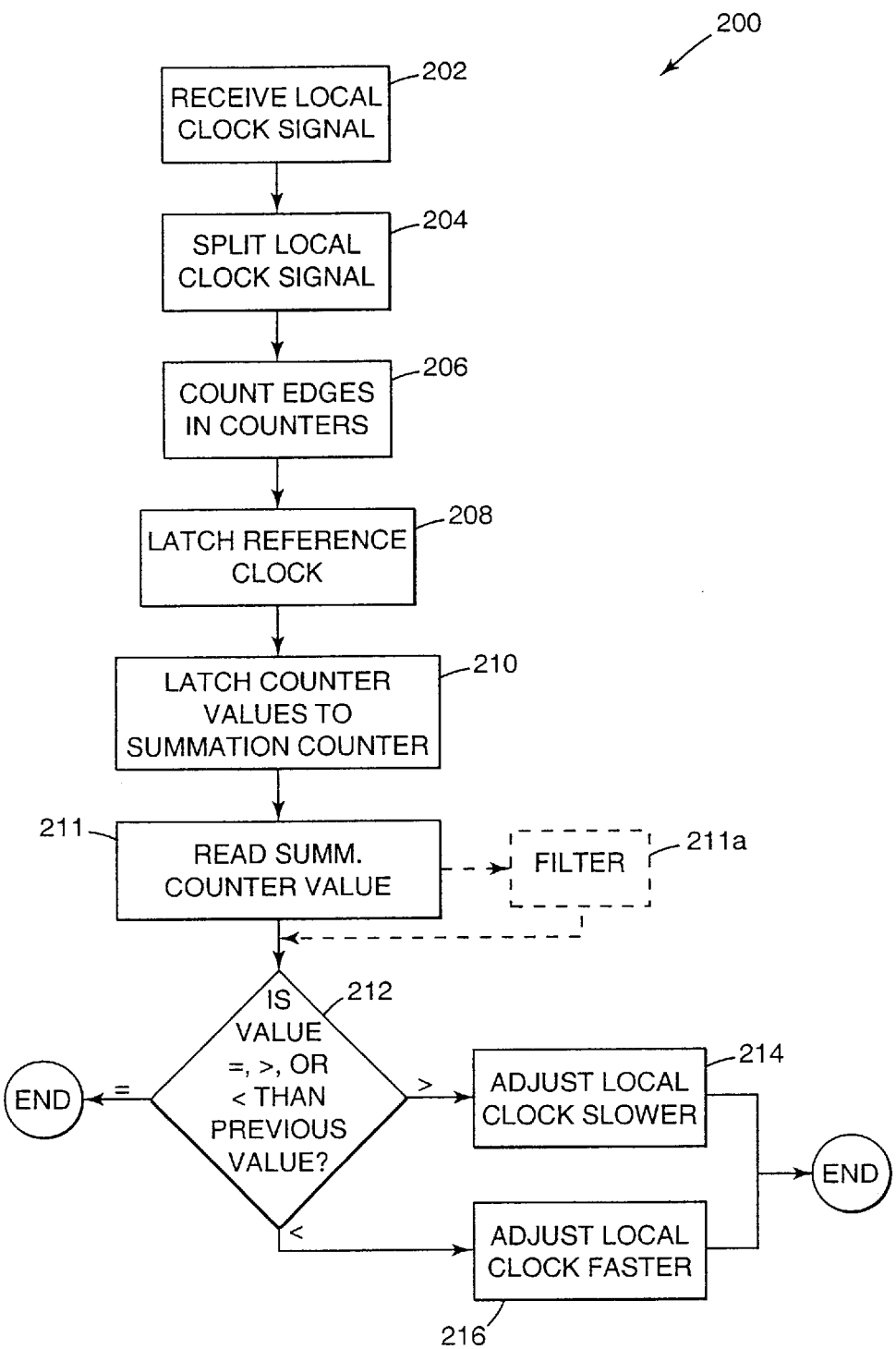
FIG. 2 is a flow chart diagram of a method according to one embodiment of the present invention.

A method 200 for implementing a phase locked loop is shown in detail in the flowchart diagram of FIG. 2. Method 200 comprises receiving a local clock signal in block 202, and splitting the local clock signal into phases in block 204. Once the local clock signal is split into phases, the rising and the falling edges of each of the phases are counted, each in its own counter in block 206. That is, in one embodiment, with the local clock signal split into two phases, four counters are used to count the rising and falling edges of each phase. On a predetermined schedule subject to a reference clock frequency, the reference clock is latched into a summation counter on the predetermined schedule in block 208. When the reference clock is latched into the summation counter, the summation counter latches counter information from the four edge counters and sums them together in block 210. This sum is indicative of the number of edges in the predetermined time period between latches of the reference clock. This sum is read in one embodiment by a CPU in block 211. In one embodiment, the counters are implemented in a FPGA.

In decision block 212, the counter value from the summation counter is compared with the last counter value from the summation counter. If the new counter value is greater than the saved counter value, the local clock is running faster than the reference or source clock. If the new counter value is less than the old counter value, the local clock is running slower than the reference or source clock. Over time, a pattern of increasing or decreasing counter values indicates local clock drift. One time changes maybe due to high frequency jitter which can affect counter values. To largely eliminate high frequency jitter effects, the counter values read by the CPU in block 211 are filtered through a low pass filter in block 211*a*.

If a pattern of increasing or decreasing counter values is detected, then local clock correction is accomplished in blocks 214 or 216 depending upon the clock drift. A software filter processes the values through a filter to determine the proper correction to meet clock standards. Adjustment of the clock is accomplished once the proper correction has been determined.

At initialization in one embodiment, the summation counter is set to its middle value. It is easier from an implementation standard that the counter runs around 8 KHz. Counter values tend to roam generally around the middle of the range of the counter and do not reach the edge. The CPU reads a value every 10 ms, runs the read data through a filter, and computes a value for the D/A converter. The D/A is adjusted for various clocks. Accuracy achieved thereby meets Stratum3 Bellcore clock standards.

Figure 2A:
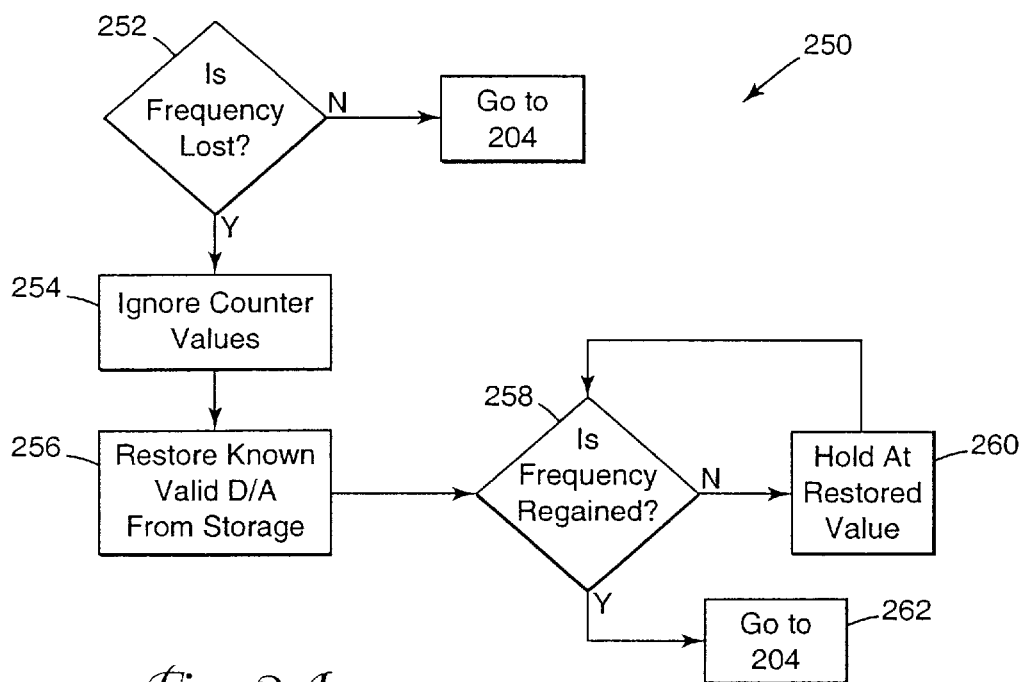
FIG. 2A is a flow chart diagram of a method according to another embodiment of the present invention.

In another embodiment, a predetermined number of summation counter values are stored in a register or other memory. A sub-method 250 for system operation upon signal loss is shown in FIG. 2A. In method 250, it is determined in decision block 252 whether the reference signal has been lost. If the signal has not been lost, operation continues normally at block 204 of method 200. If the signal has been lost, further counter values from the summation counter are ignored in block 254, and known valid stored D/A values are used to return the local clock to a last known valid frequency in block 256.

In an error situation, such as when the reference or source clock signal is lost, during a switchover to a new clock source, for out of range input signals, for other failure states in which the PLL cannot properly track the input signal, further counter values are ignored. In such a situation, the stored summation counter readings allow the D/A for the local clock to be slowly returned to the last known valid value. Once the known valid stored value is reached, it is kept fixed in block 260 until a signal input is reestablished. In this situation, frequency accuracy is a function only of the intrinsic performance of the local clock (VCTCXO) and the stability of the D/A output. Decision block 258 determines if the signal has been regained. If the signal is regained, process flow continues at block 204 of method 200. If not, the clock runs at the restored value until the signal is regained.

Figure 3:
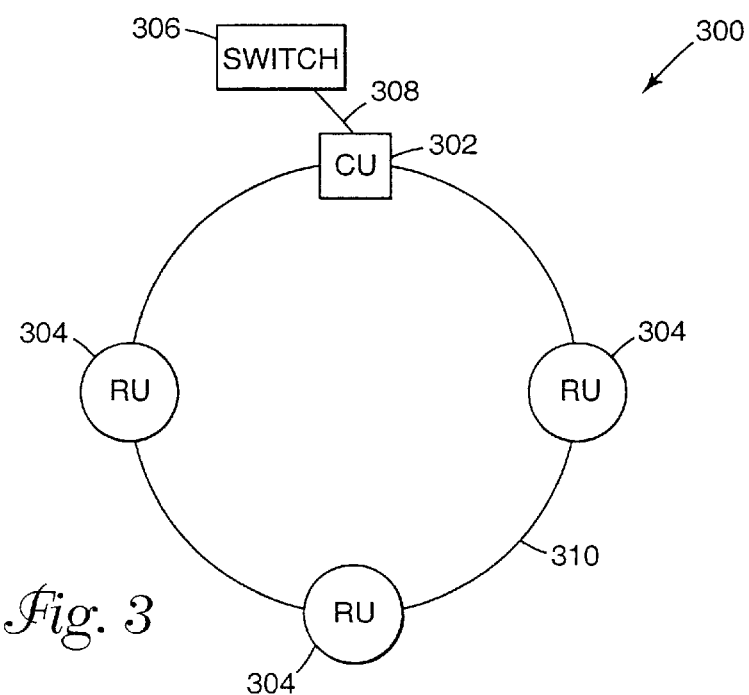
FIG. 3 is a block diagram of a system according to one embodiment of the present invention.

An embodiment of a Digital Loop Carrier (DLC) 300 is shown in FIG. 3. In DLC 300, a central unit 302 is connected to a number or remote units 304 over a synchronous, high speed ring 310. Ring 310 in one embodiment comprises a SONET ring. In another embodiment, ring 310 comprises an SDH ring. The central unit is also connected to a switch 306 by analog or digital transmission line 308. In this embodiment, each of the remote units 304 operates software such as that described above to lock its local clock to a reference or source clock provided by the central unit 302.

The methods shown above, as well as the modules and sub-modules described above are implemented in various embodiments in a machine readable medium comprising machine readable instructions for causing a computer or central processing unit to perform the methods. The computer programs run on the central processing unit out of main memory, and may be transferred to main memory from permanent storage in various ways.

The machine readable medium may include software modules and computer programs comprising multiple modules or objects to perform the methods described above, or to perform the functions of various modules in the apparatuses described above. The type of computer programming languages used to write the code may vary between procedural code type languages to object oriented languages. The files or objects need not have a one to one correspondence to the modules or steps described depending on the desires of the programmer. Further, the methods and apparatus may comprise combinations of software, hardware and firmware as is well-known to those skilled in the art. The software implementing various embodiments of the present invention may implemented by computer programs of machine-executable instructions written in any number of suitable languages and stored on machine or computer readable media such as disk, diskette, RAM, ROM, or other device commonly included in a personal computer.

CONCLUSION

In a telecommunications system, typically the local clock is at a known frequency. That known frequency is divided into at least two phases, and the rising and the falling edges of each of the divided signals are counted. The sum total of edges in a given time period is compared to a stored sum of edges during an earlier time period of the same duration. If the local clock is at an acceptable frequency, then there will be very little if any movement between the current summed value and the last summed value. A comparison is made between the current summation counter value and the last summation counter value, and the local clock is adjusted if necessary, after filtering the counter results to determine the proper clock correction to meet clock standards.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method of locking a local clock to a reference clock, comprising:
    dividing the local clock into a plurality of phases;
    counting the total number of rising and falling edges of the local clock;
    periodically summing the total number of rising and falling edges in a predetermined time period;
    comparing the summed total number of rising and falling edges in the predetermined time period to a stored summed total number of rising and falling edges in an earlier time period; and
    adjusting the local clock if the compared summed and stored totals differ by more than a predetermined amount.

2. The method of claim 1, wherein adjusting the local clock comprises:
    slowing down the local clock if the summed total number of edges is greater than the stored total number of edges; and
    speeding up the local clock if the summed total number of edges is less than the stored total number of edges.

3. The method of claim 1, and further comprising:
    filtering the read value through a low pass filter before comparing the read value with a previously stored value.

4. The method of claim 1, and further comprising:
    storing a predetermined number of previous known valid values.

5. The method of claim 4, and further comprising:
    adjusting to a last of the known valid stored values if the reference clock signal is lost.

6. The method of claim 1, and further comprising:
    adjusting to a last known valid value from a stored set of previous known valid values.

7. The method of claim 6, wherein adjusting comprises:
    ignoring further counter values from the summation counter if the reference clock signal has been lost;
    restoring a known valid stored value from the stored valid values; and
    holding the frequency at the known valid value until the reference clock signal is restored.

8. The method of claim 1, wherein the local clock is divided into two phases, and wherein four difference counters are utilized, each difference counter counting a rising or a falling edge of one of the two phases of the divided local clock.

9. The method of claim 1, wherein summing of the counter values is triggered by a latching of the reference clock to a summation counter.

10. The method of claim 1, and further comprising:
storing a plurality of summed values for a known time period in excess of the first and the second predetermined periods, and adjusting to one of the known valid stored values if the reference clock signal is lost.

11. The method of claim 1, and further comprising:
resetting the bank of difference counters upon loss of the clock signal or initialization.

12. The method of claim 1, wherein the number of rising and falling edges are counted in a bank of difference counters.

13. The method of claim 1, wherein the counters are implemented in a field programmable gate array.

14. The method of claim 1, wherein the counter results are filtered with a software filter to determine a proper clock correction.

15. A method for implementing a phase locked loop, comprising:
dividing a local clock signal of known frequency into two signals each at half the frequency of the local clock signal;
counting the rising edge and the falling edge of the divided clock signals in a first known time period;
summing the counts of the plurality of counters with a summation counter;
reading the value of the summation counter at a second known time period;
comparing the read value with a previously stored value; and
adjusting the local clock upon determining that the read value and the previously stored value differ by more than a predetermined amount.

16. The method of claim 15, wherein adjusting the local clock comprises:
slowing down the local clock if the summed total number of edges is greater than the stored total number of edges; and
speeding up the local clock if the summed total number of edges is less than the stored total number of edges.

17. The method of claim 15, and further comprising:
filtering the read value through a low pass filter before comparing the read value with a previously stored value.

18. The method of claim 15, and further comprising:
adjusting to a last value of a stored set of known valid stored values if the reference clock signal is lost.

19. The method of claim 17, wherein adjusting comprises:
ignoring further counter values from the summation counter if the reference clock signal has been lost;
restoring a known valid stored D/A value from a register of stored valid values; and
holding the frequency at the known valid value until the reference clock signal is restored.

20. The method of claim 12, wherein summing of the counter values is triggered by a latching of the reference clock to a summation counter.

21. A method for detecting clock errors between a local clock and a reference clock, comprising:
counting a number of local clock cycles in a predetermined time period;
summing a count of the local clock cycles in a summation counter at an end of the predetermined time period; and
adjusting the local clock if a difference between the summed count and a previously stored count exceeds a predetermined difference.

22. The method of claim 21, wherein adjusting the clock comprises:
increasing the clock speed if the summed count is less than the stored count; and
decreasing the clock speed if the summed count is greater than the stored count.

23. The method of claim 21, wherein counting the number of clock cycles comprises:
dividing the clock signal into a plurality of phases; and
counting in a plurality of separate counters each rising and falling edge of each of the plurality of phases.

24. The method of claim 21, wherein summing the count of clock cycles comprises:
latching the reference clock to the summation counter periodically; and
latching the difference counter counts into the summation counter when the reference clock is latched.

25. The method of claim 21, and further comprising:
determining whether the reference signal has been lost;
ignoring further counter values from the summation counter if the reference signal has been lost;
restoring a known valid stored value; and
holding the frequency at the known valid value until the reference signal is restored.

26. A method for jitter compensation in locking a local clock to a reference clock, comprising:
dividing the local clock signal into a plurality of phase shifted signals;
counting in a predetermined time period each edge of each of the divided signals;
summing the number of edges counted;
reading the summed number;
filtering the summed number through a low pass filter;
comparing the summed number to a stored previous summed number; and
adjusting the local clock for differences in the compared numbers.

27. A phase-locked loop, comprising:
a phase detector having a local clock signal input and a counter signal output, the phase detector comprising:
a divider connected to the local clock signal input;
a plurality of difference counters connected to receive divided signals from the divider; and
a summation counter connected to the outputs of each of the plurality of difference counters and connected to receive an external latch signal to trigger summation of the difference counters.

28. A digital phase locked loop, comprising:
a divider to receive a local clock signal and divide the local clock signal into two phases;
four 14 bit counters each counting a rising or a falling edge of one of the two phases;
a 16 bit summation counter summing the difference counter values upon receiving a latch signal from an external reference source; and
a control module to read the summed value and to adjust the local clock speed if necessary.

29. The phase locked loop of claim 28, wherein the control module comprises:

a storage medium to store a plurality of summed values from the summation counter; and a central processing unit to read the summed value of the summation counter and to compare it to a last stored value.

30. The phase locked loop of claim 29, wherein the control module further comprises:

a low pass filter to reduce high frequency jitter.

31. A phase-locked loop, comprising:

a phase detector connected to a local clock source, the phase detector comprising:

a divider having an output;

a plurality of counters each having an input connected to the divider output and an output; and a summation counter connected to the outputs of each of the plurality of counters and to an external clock source; and a software module to control the operation of the phase detector.

32. The phase locked loop of claim 31, wherein the software module comprises:

a storage register to store a plurality of summation counter values;

a read module to periodically read a value from the summation counter; and a comparison module to compare a current summation counter value to a last of the stored plurality of summation counter values.

33. The phase locked loop of claim 32, wherein the software module further comprises:

an error checking module to disable further summation counter reading if a reference signal to the phase locked loop is lost.

34. A method for use in a telecommunications system, wherein the system includes:

a remote node having software to lock a local clock to a network clock, the software comprising machine readable instructions for performing a method comprising:

dividing the local clock into a plurality of phases;

counting the total number of rising and falling edges of the local clock in a bank of difference counters;

periodically summing the total number of rising and falling edges in a predetermined time period;

comparing the summed total number of rising and falling edges in the predetermined time period to a stored summed total number of rising and falling edges in an identical earlier time period; and adjusting the local clock if the compared summed and stored totals differ by more than a predetermined amount.

35. The method of claim 34, further comprising implementing the counters in a field programmable gate array.

36. The method of claim 34, wherein adjusting the local clock further comprises filtering the counter sums with a software filter to determine proper clock correction.

37. A SONET/SDH system with a central unit and a plurality of remote units, each remote unit having hardware to lock remote clocks to a central clock, the hardware comprising:

a phase locked loop comprising:

a phase detector having a local clock signal input and a counter signal output, the phase detector comprising:

a divider connected to the local clock signal input;

a plurality of difference counters connected to receive divided signals from the divider; and a summation counter connected to the outputs of each of the plurality of difference counters and connected to receive an external latch signal to trigger summation of the difference counters.

38. A digital loop carrier (DLC), comprising:

a synchronous high speed ring;

a central unit connected to the ring; and a plurality of remote units connected to the ring, each remote unit having a phase locked loop comprising:

a phase detector having a local clock signal input and a counter signal output, the phase detector comprising:

a divider connected to the local clock signal input;

a plurality of difference counters connected to receive divided signals from the divider; and a summation counter connected to the outputs of each of the plurality of difference counters and connected to receive an external latch signal to trigger summation of the difference counters.

39. The digital loop carrier (DLC) of claim 38, and further comprising:

a software module to control the operation of the phase detector.

40. The DLC of claim 39, wherein the software module comprises:

a storage register to store a plurality of summation counter values;

a read module to periodically read a value from the summation counter; and a comparison module to compare a current summation counter value to a last of the stored plurality of summation counter values.

* * * * *